(12) United States Patent
Kanao et al.

(10) Patent No.: US 6,194,907 B1
(45) Date of Patent: Feb. 27, 2001

(54) PROBER AND ELECTRIC EVALUATION METHOD OF SEMICONDUCTOR DEVICE

(75) Inventors: Tsuyoshi Kanao, Hyogo; Koji Eguchi; Toru Yamaguchi, both of Tokyo, all of (JP)

(73) Assignees: Mitsubishi Denki Kabushiki Kaisha, Tokyo; Ryoden Semiconductor System Engineering Corporation, Itami, both of (JP)

( * ) Notice: Subject to any disclaimer, the term of this patent is extended or adjusted under 35 U.S.C. 154(b) by 0 days.

(21) Appl. No.: 09/326,604

(22) Filed: Jun. 7, 1999

(30) Foreign Application Priority Data

Dec. 17, 1998 (JP) .................................................. 10-359326

(51) Int. Cl.$^7$ .................................................. G01R 31/02
(52) U.S. Cl. .......................... 324/760; 324/754; 324/627
(58) Field of Search .................................. 324/627, 760, 324/754, 755

(56) References Cited

U.S. PATENT DOCUMENTS 4,757,255 * 7/1988 Margozzi ............................ 324/760
5,835,997 * 11/1998 Yassine ............................... 324/754

FOREIGN PATENT DOCUMENTS 62-63439   3/1987   (JP) .
1-181432   7/1989   (JP) .

* cited by examiner

Primary Examiner—Safet Metjahic
Assistant Examiner—Anjan K Deb
(74) Attorney, Agent, or Firm—Oblon, Spivak, McClelland, Maier & Neustadt, P.C.

(57) ABSTRACT

A prober can make an appropriate evaluation in a microcurrent region. A wafer (9) is disposed on a chuck (8) in a casing (1). In the upper surface of the chuck (8), an electrode (8a) is formed which is connected to a power supply (11) via a wire (10). In the casing (1), a cylindrical electromagnetic shielding box (7) is disposed with the upper surface open. The upper surface of the casing (1) and the side surfaces and bottom surface of the electromagnetic shielding box (7) form a closed space (30) for surrounding the chuck (8) and the wafer (9). Also, a loader (6) for driving the chuck (8) and the electromagnetic shielding box (7) is disposed in the casing (1). On the upper surface of the casing (1), a tester head (3) is disposed with a probe card (4) disposed therein. Since part of the upper surface of the casing (1) is open, probe needles (5) of the probe card (4) protrude into the casing (1) through the opening.

16 Claims, 10 Drawing Sheets

PROBER AND ELECTRIC EVALUATION METHOD OF SEMICONDUCTOR DEVICE

BACKGROUND OF THE INVENTION

1. Field of the Invention

The present invention relates to the structure of a prober, and an electric evaluation method of semiconductor devices using the prober.

2. Description of the Background Art

A prober is a device for evaluating electric characteristics of semiconductor devices formed on a wafer by contacting input/output terminals of chips with probe needles to make signal transmissions to/from a tester.

FIG. 15 is a side view schematically showing the structure of a conventional prober. A wafer 109 with semiconductor devices to be evaluated (not shown) is placed on a chuck 108. In the upper surface of the chuck 108, an electrode 108a is provided to establish electric contact with the semiconductor devices from the back surface of the wafer 109. This electrode 108a is connected to a power supply 111 via a wire 110. Also, an electric heater 107 for controlling the temperature of the wafer 109 during evaluation of the semiconductor devices is provided in the chuck 108.

With a recent scaledown of semiconductor devices, the ability to perform an evaluation in a microcurrent region has increasingly been required of the prober. The chuck 108 is thus disposed within an electromagnetic shielding 101 to shield electromagnetic waves produced by peripheral equipment such as the power supply 111 thereby to reduce an electric noise which adversely affects evaluation.

In the electromagnetic shielding 101, a ventilation fan 102 for ventilating the electromagnetic shielding 101 is provided. Also, a loader 106 for driving the chuck 108 in each direction X, Y, Z shown in FIG. 15 is provided in the electromagnetic shielding 101. The loader 106 includes an XY loader portion 106c for driving the chuck 108 in the directions X, Y; and a Z loader portion 106d for driving the chuck 108 in the direction Z. The top end of the Z loader portion 106d is fixed to the bottom surface of the chuck 108. The loader 106 further includes a motor portion 106a for producing a driving force given to the XY loader portion 106c and the Z loader portion 106d; and a driving-force transmission portion 106b for transmitting the driving force to the XY loader portion 106c and the Z loader portion 106d.

Further on the upper surface of the electromagnetic shielding 101, a tester head 103 is placed with a probe card 104 disposed in the bottom. Part of the upper surface of the electromagnetic shielding 101 is open, through which probe needles 105 of the probe card 104 protrude into the electromagnetic shielding 101.

In this conventional prober, the electromagnetic shielding 101 can shield electromagnetic waves produced by the peripheral equipment, e.g., the power supply 111, but cannot shield electromagnetic waves produced by the equipment disposed therein, e.g., the ventilation fan 102, the motor portion 106a of the loader 106, and the electric heater 107. In the electric evaluation of semiconductor devices using such a prober, unshielded electromagnetic waves become several hundred fA levels of electric noise, interfering with the evaluation in the microcurrent region.

SUMMARY OF THE INVENTION

A first aspect of the present invention is directed to a prober comprising: a casing having a surface with a signal supply portion for supplying an electric signal for evaluation to a semiconductor device to be evaluated, the semiconductor device formed on a wafer; a table to place the wafer; and an electromagnetic shielding body having side surfaces which face a side rim of the table and which are in contact with the surface of the casing during evaluation of the semiconductor device, and a bottom surface facing a back surface of the table, the electromagnetic shielding body forming a space for surrounding the table with the surface of the casing, the side surface in contact with the surface of the casing, and the bottom surface, both the table and the electromagnetic shielding body disposed within the casing.

According to a second aspect of the present invention, the space for surrounding the table is a closed space; and the electromagnetic shielding body has a gas inlet for introducing inert gas into the closed space.

According to a third aspect of the present invention, the space for surrounding the table is a closed space; and the electromagnetic shielding body has an air outlet for evacuating the closed space by exhausting the air from the closed space.

According to a fourth aspect of the present invention, the space for surrounding the table is a closed space; and the electromagnetic shielding body has a gas inlet for introducing, into the closed space, heating/cooling gas for controlling the temperature in the closed space.

According to a fifth aspect of the present invention, the table has an electrode to establish electric contact with the semiconductor device from the back surface of the wafer; and the prober further comprising: a wire for maintaining the electromagnetic shielding body and the electrode at the same potential.

According to a sixth aspect of the present invention, the prober further comprises: a conductive plate extending from a portion of the surface of the casing in contact with the side surfaces of the electromagnetic shielding body in a direction of the space.

A seventh aspect of the present invention is directed to an electric evaluation method of semiconductor devices using a prober. The prober comprises: a casing having a surface with a signal supply portion having an electrode for supplying an electric signal for evaluation to a semiconductor device to be evaluated; a table to place the semiconductor device; a first driving portion driving the table in a normal direction of the surface of the casing, within the casing; an electromagnetic shielding body having side surfaces facing a side rim of the table and a bottom surface facing a back surface of the table, the electromagnetic shielding body forming a space for surrounding the table with the surface of the casing, the side surfaces, and the bottom surface when the side surfaces are in contact with the surface of the casing; and a second driving portion driving the electromagnetic shielding body in the normal direction within the casing, the table, the electromagnetic shielding body, and the first and second driving portions all disposed within the casing. The electric evaluation method comprises the steps of: (a) contacting the semiconductor device with the electrode by driving the table by the first driving portion; (b) contacting the side surfaces of the electromagnetic shielding body with the surface of the casing by driving the electromagnetic shielding body by the second driving portion; and (c) after the steps (a) and (b), supplying the electric signal to the semiconductor device from the signal supply portion via the electrode.

According to an eighth aspect of the present invention, the space for surrounding the table is a closed space; and the electromagnetic shielding body has a gas inlet for introducing inert gas into the closed space. The electric evaluation method further comprises the step of: (d) before the step (c), introducing the inert gas into the closed space from the gas inlet.

According to a ninth aspect of the present invention, the space for surrounding the table is a closed stage; and the electromagnetic shielding body has an air outlet for exhausting the air from the closed space. The electric evaluation method further comprises the step of: (d) before the step (c), evacuating the closed space by exhausting the air from the closed space through the air outlet.

According to a tenth aspect of the present invention, the space for surrounding the table is a closed space; and the electromagnetic shielding body has a gas inlet for introducing heating/cooling gas into the closed space. The electric evaluation method further comprises the step of: (d) before the step (c), controlling the temperature in the closed space by introducing the heating/cooling gas into the closed space from the gas inlet.

In the prober of the first aspect, during evaluation of semiconductor devices, the table and the wafer placed on the table are surrounded by the electromagnetic shielding body disposed within the casing. The electromagnetic shielding body can thus appropriately reduce an electric noise due to surrounding electromagnetic waves.

In the prober of the second aspect, by introducing inert gas from the gas inlet, the electric evaluation of semiconductor devices can be performed with the closed space filled with inert gas. This suppresses deterioration of the semiconductor devices, etc. with time during the electric evaluation.

In the prober of the third aspect, by exhausting the air from the closed space through the air outlet, the electric evaluation of semiconductor devices can be performed with the closed space evacuated. This suppresses deterioration of the semiconductor devices, etc. with time during the electric evaluation.

In the prober of the fourth aspect, by introducing heating/cooling gas from the gas inlet, the temperature in the closed space, in turn, the temperature of the wafer, can be arbitrarily adjusted by the temperature of the heating/cooling gas.

In addition, as compared with a case where an electric heater is provided inside the table, the prober prevents electromagnetic waves produced by the electric heater from growing into an electric noise during the evaluation.

In the prober of the fifth aspect, the electrode of the table and the electromagnetic shielding body are maintained at the same potential by the wire. This avoids the influence of an electric noise due to a potential difference between the electrode and the electromagnetic shielding body.

In the prober of the sixth aspect, the electrode of the table, the electromagnetic shielding body, and the conductive plate are maintained at the same potential. The conductive plate can thus shield electromagnetic waves emitted from the upper surface side of the wafer.

In the electric evaluation method of the seventh aspect, by contacting the side surfaces of the electromagnetic shielding body with the surface of the casing in the step (b), the wafer and the table are surrounded with the surface of the casing and the side surfaces and bottom surface of the electromagnetic shielding body. The electromagnetic shielding body can thus appropriately reduce an electric noise due to surrounding electromagnetic waves.

In the electric evaluation method of the eighth aspect, the closed space is filled with inert gas in the step (d) and then in the step (c) an electric signal is supplied to semiconductor devices. This suppresses deterioration of the semiconductor devices, etc. with time during the electric evaluation.

In the electric evaluation method of the ninth aspect, the closed space is evacuated in the step (d) and then in the step (c) an electric signal is supplied to semiconductor devices. This suppresses deterioration of the semiconductor devices, etc. with time during the electric evaluation.

In the electric evaluation method of the tenth aspect, heating/cooling gas is introduced into the closed space in the step (d) and then in the step (c) an electric signal is supplied to the semiconductor devices. This makes it possible to arbitrarily adjust the temperature in the closed space, in turn, the temperature of the wafer, by the temperature of the heating/cooling gas.

In addition, as compared with a case where an electric heater is provided inside the table, the method prevents electromagnetic waves produced by the electric heater from growing into an electric noise during the evaluation.

Thus, an objective of the present invention is to obtain a prober that can make an appropriate evaluation in the microcurrent region by shielding the electromagnetic waves produced by a ventilation fan or a motor portion of a loader to reduce an electric noise during the evaluation. Another objective is to achieve an electric evaluation method of semiconductor devices using such a prober.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
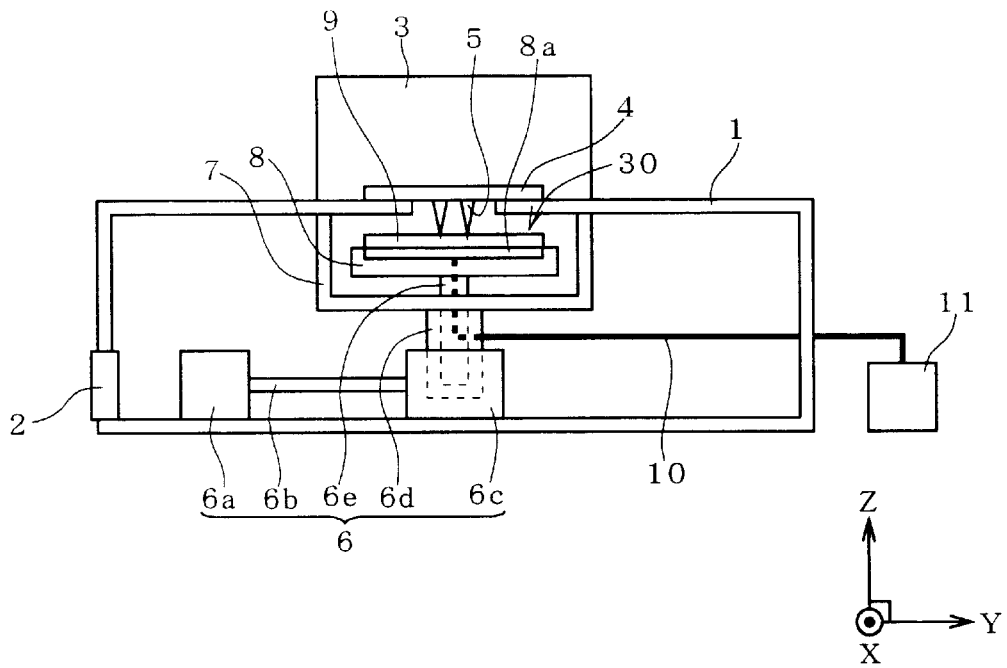
FIG. 1 is a side view schematically showing the structure of a prober according to a first preferred embodiment of the present invention.

FIG. 1 is a side view schematically showing the structure of a prober according to a first preferred embodiment of the present invention. A wafer 9 with semiconductor devices to be evaluated (not shown) is placed on a chuck 8 in a casing 1. In the upper surface of the chuck 8, an electrode 8a is provided to establish electric contact with the semiconductor devices from the back surface of the wafer 9. This electrode 8a is connected to a power supply 11 via a wire 10. Here, to shield electromagnetic waves produced by peripheral equipment such as the power supply 11 to reduce an electric noise during evaluation, the casing 1 is preferably constituted of an electromagnetic shielding body.

In the casing 1, a cylindrical electromagnetic shielding box 7 is disposed with the upper surface open. The electromagnetic shielding box 7 has side surfaces in contact with the upper surface of the casing 1 during the evaluation of semiconductor devices, which face the side rims of the chuck 8; and a bottom surface below the chuck 8, facing the bottom surface of the chuck 8. The contact of the side surfaces of the electromagnetic shielding box 7 with the upper surface of the casing 1 can be broken off by driving a Z loader portion 6d described later. With the top ends of the side surfaces of the electromagnetic shielding box 7 in contact with the upper surface of the casing 1, the upper surface of the casing 1 and the side surfaces and bottom surface of the electromagnetic shielding box 7 form a closed space 30 for surrounding the chuck 8 and the wafer 9.

In the casing 1, a ventilation fan 2 for ventilating the inside of the casing 1 is further provided. Also, a loader 6 for driving the chuck 8 and the electromagnetic shielding box 7 in each direction X, Y, Z shown in FIG. 1 is disposed in the casing 1. Here the direction X is a direction perpendicular to the plane of the drawing, and the direction Y is a horizontal direction in the drawing. For example, the plane XY includes the respective upper surfaces of the wafer 9 and the casing 1. Further, the direction Z is a vertical direction in the drawing which agrees, for example, with the normal directions of the respective upper surfaces of the wafer 9 and the casing 1. The loader 6 includes an XY loader portion 6c for driving the chuck 8 and the electromagnetic shielding box 7 together in the directions X,Y; the Z loader portion 6d for driving the electromagnetic shielding box 7 in the direction Z; and a Z loader portion 6e for driving the chuck 8 in the direction Z. The top ends of the Z loader portions 6d and 6e are fixed to the bottom surfaces of the electromagnetic shielding box 7 and the chuck 8, respectively. The loader 6 further includes a motor portion 6a for producing a driving force given to the XY loader portion 6c and the Z loader portions 6d and 6e; and a driving-force transmission portion 6b for transmitting the driving force to the XY loader portion 6c and the Z loader portions 6d and 6e.

On the upper surface of the casing 1, a tester head 3 is disposed with a probe card 4 disposed in the bottom. As shown in FIG. 1, the probe card 4 may be regarded as part of the upper surface of the casing 1. Part of the upper surface of the casing 1 is open, through which probe needles 5 of the probe card 4 protrude into the casing 1.

FIGS. 2 through 7 are side views to explain, in order of steps, an electric evaluation method of semiconductor devices using the prober of the first preferred embodiment in FIG. 1. To simplify the drawings, the wire 10 and the power supply 11 are not shown.

1–1. First Step

Figure 2:
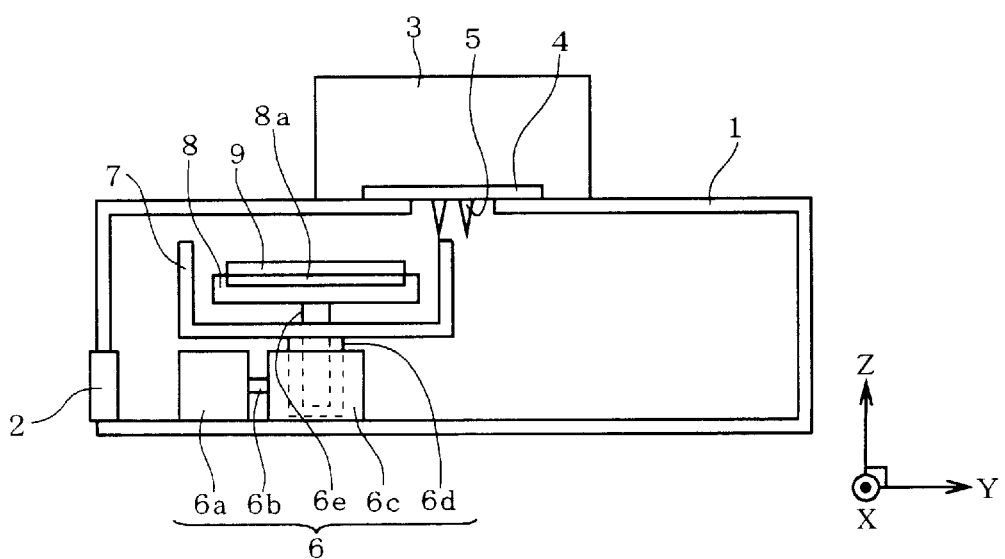
FIGS. 2 through 7 are side views to explain, in order of steps, an electric evaluation method of semiconductor devices using the prober of the first preferred embodiment.

First, the XY loader portion 6c is driven to move the electromagnetic shielding box 7 and the chuck 8 into position to replace the wafer 9. At this time, both the electromagnetic shielding box 7 and the chuck 8 are lowered by the Z loader portions 6d and 6e, respectively. In this condition, the wafer 9 is arranged in alignment on the electrode 8a of the chuck 8 (FIG. 2).

1–2. Second Step

Figure 3:
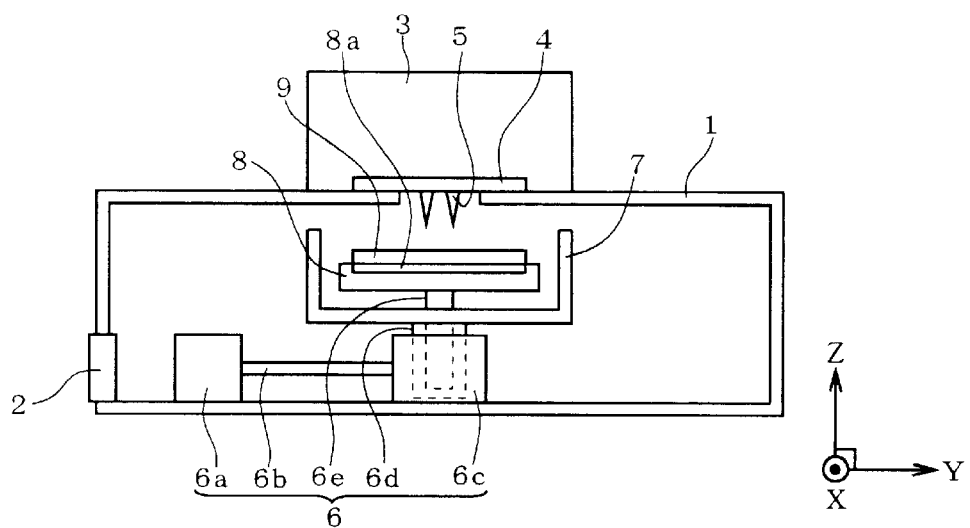

Then, the Z loader 6c is driven to move the electromagnetic shielding box 7 and the chuck 8 so that out of a plurality of semiconductor devices formed on the wafer 9, input/output terminals (not shown) of a semiconductor device to be evaluated first come directly below the probe needles 5 (FIG. 3).

1–3. Third Step

Figure 4:
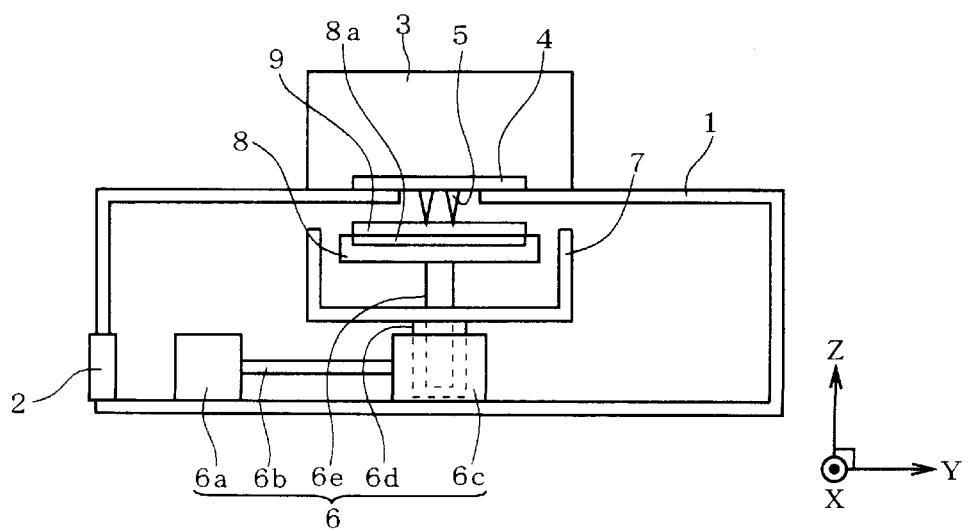

Then, the chuck 8 is raised in the direction Z by driving the Z loader portion 6e to contact the above input/output terminals with the probe needles 5 (FIG. 4).

1–4. Fourth Step

Then, the Z loader portion 6d is driven to raise the electromagnetic shielding box 7 in the direction Z to contact the top ends of the side surfaces of the electromagnetic shielding box 7 with the upper surface of the casing 1. This forms the closed space 30 or surrounding the chuck 8 and the wafer 9 with the upper surface of the casing 1 and the side surfaces and bottom surface of the electromagnetic shielding box 7. Here the probe card 4 is regarded as part of the upper surface of the casing 1, but when the probe card 4 and the upper surface of the casing 1 are treated as a separate entity, the closed space 30 is formed with the probe card 4, the upper surface of the casing 1, and the side surfaces and bottom surface of the electromagnetic shielding box 7. The processing of the fourth step described so far may be simultaneously performed with the above third step.

Figure 5:
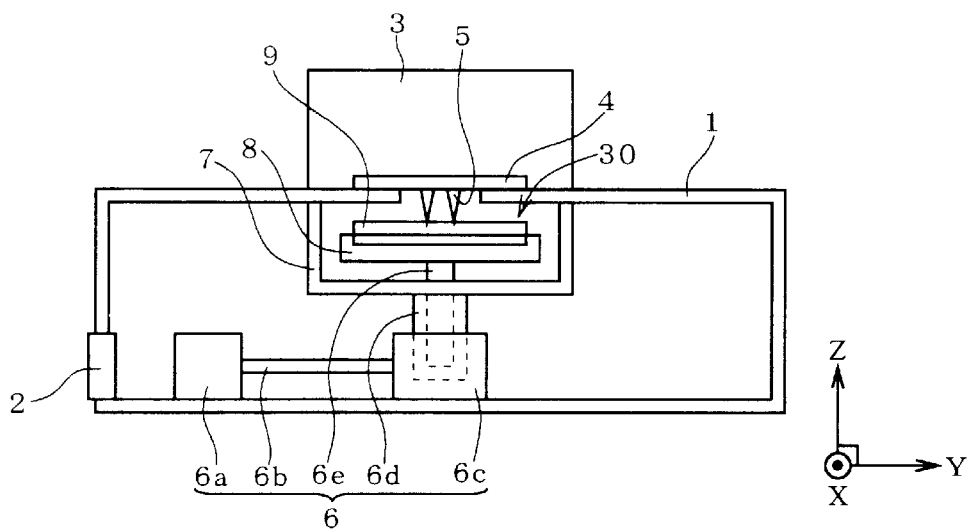

In this condition, an electric signal for evaluation is applied from the tester head 3 to the semiconductor device via the probe needles 5 and the above input and output terminals. Further, the power supply 11 supplies a given potential to the semiconductor device from the back surface of the wafer 9 via the wire 10 and the electrode 8a. The electric evaluation of the semiconductor device to be evaluated first is performed in this way (FIG. 5).

1–5. Fifth Step

Figure 6:
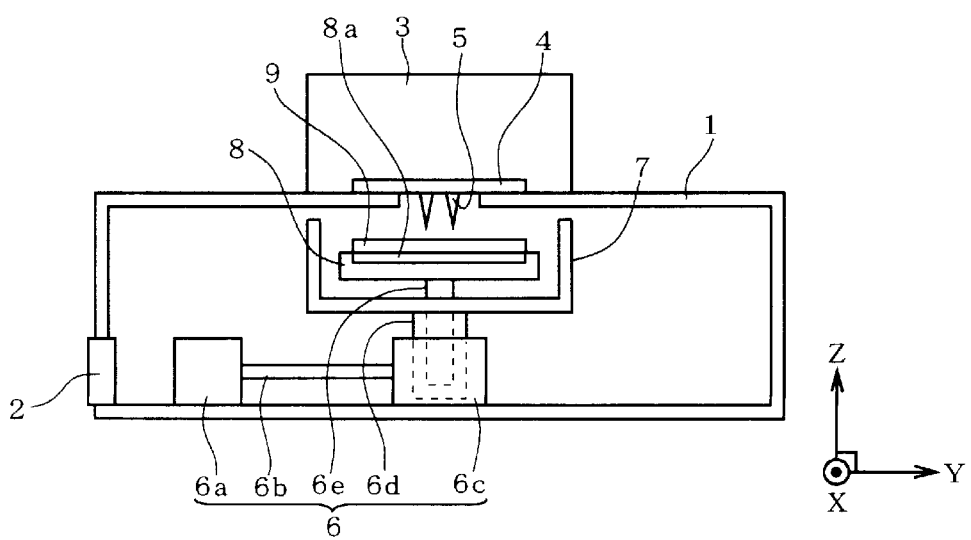

After completing the electric evaluation of the semiconductor device to be evaluated first and stopping the application of the electric signal from the tester head 3 and the supply of a given potential from the power supply 11, the Z loader portions 6d and 6e are driven to lower the electromagnetic shielding box 7 and the chuck 8 slightly in the direction Z. This breaks off the contact of the side surfaces of the electromagnetic shielding box 7 with the upper surface of the casing 1, and the contact of the input/output terminals of the semiconductor device to be evaluated first with the probe needles 5 (FIG. 6).

1–6. Sixth Step

Figure 7:
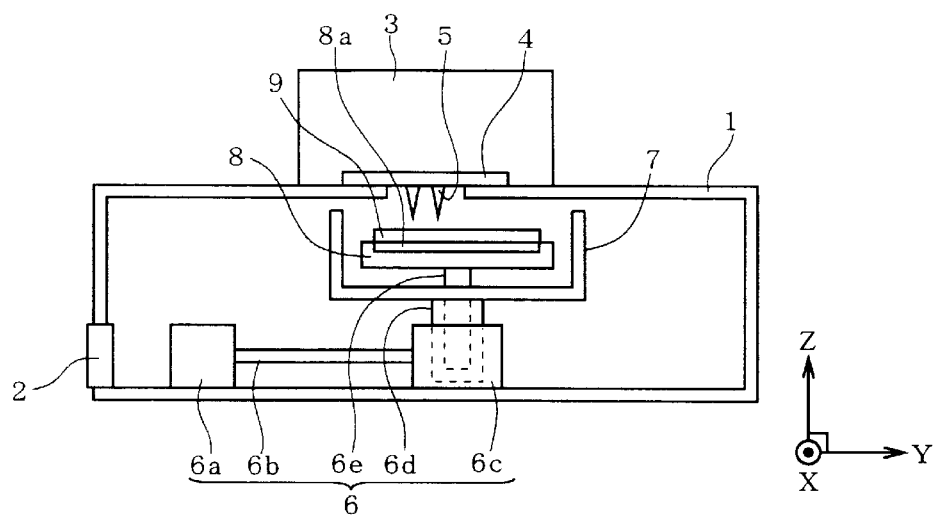

Then, the XY loader portion 6c is driven to move the electromagnetic shielding box 7 and the chuck 8 so that out of the plurality of semiconductor devices formed on the wafer 9, input/output terminals (not shown) of a semiconductor device to be evaluated second come directly below the probe needles 5 (FIG. 7). Then, the aforementioned third through fifth steps are repeated in this order to perform an electric evaluation of the semiconductor device to be evaluated second.

These second through sixth steps are repeated for all the semiconductor devices formed on the wafer 9 to make an electric evaluation of the semiconductor devices.

According to the prober of the first preferred embodiment, during the evaluation of semiconductor devices, the chuck 8 and the wafer 9 are confined in the closed space 30 surrounded by the upper surface of the casing 1 and the side surfaces and bottom surface of the electromagnetic shielding box 7. The electromagnetic shielding box 7 can thus shield not only electromagnetic waves produced by the peripheral equipment outside the casing 1, e.g., power supply 11, but also electromagnetic waves produced by the ventilation fan 2 and the motor portion 6a of the loader 6 inside the casing 1. This reduces an electric noise during evaluation to several fA levels, thereby allowing an appropriate evaluation (e.g., measurement of fA levels of micro leakage current) in the microcurrent region.

The Japanese Patent Laid-Open No. 1-181432A discloses a prober in which a chuck is formed of a superconductive material to shield electromagnetic waves with Meissner effect, i.e., the inherent property of the superconductive conductor. However, the chuck in that prober, serving as an electromagnetic shielding body, is flat in shape so that it cannot shield electromagnetic waves emitted from the side surface side of the wafer even if it can shield electromagnetic waves emitted from the bottom surface side. On the other hand, the prober of the first preferred embodiment can shield electromagnetic waves emitted from the side surface side of the wafer 9 by the side surfaces of the electromagnetic shielding box 7 as well as shielding electromagnetic waves emitted from the bottom surface side of the wafer 9 by the bottom surface of the electromagnetic shielding box 7. Thus, the prober of the first preferred embodiment is superior in the capability of shielding electromagnetic waves to the prober in the reference.

2. Second Preferred Embodiment

Figure 8:
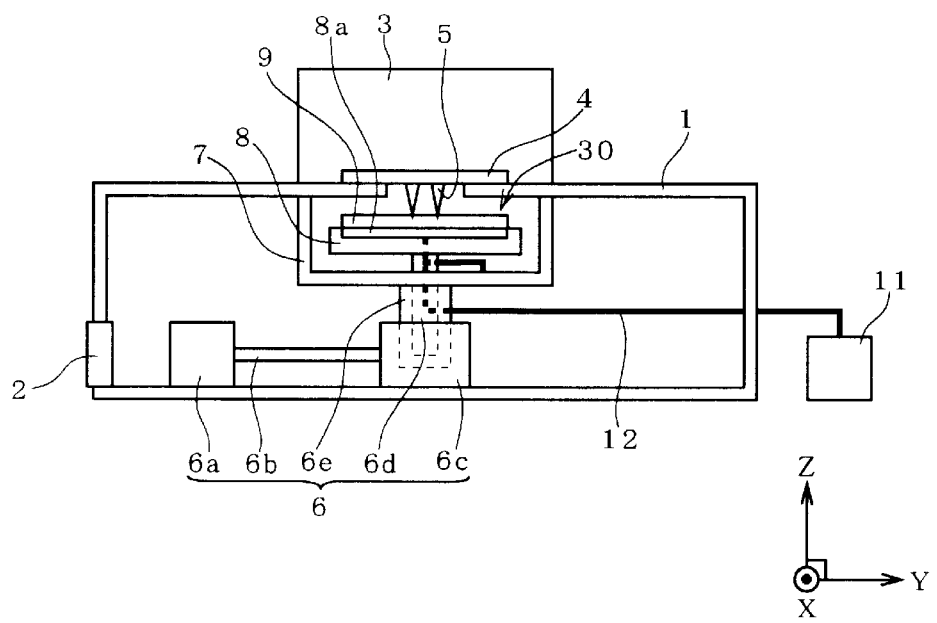
FIG. 8 is a side view schematically showing the structure of a prober according to a second preferred embodiment of the present invention.

FIG. 8 is a side view schematically showing the structure of a prober according to a second preferred embodiment of the present invention. The power supply 11, the electrode 8a of the chuck 8, and the electromagnetic shielding box 7 are connected to each other via a triaxial cable 12. The other part of the prober according to the second preferred embodiment is similar to that of the first preferred embodiment shown in FIG. 1.

Figure 9:
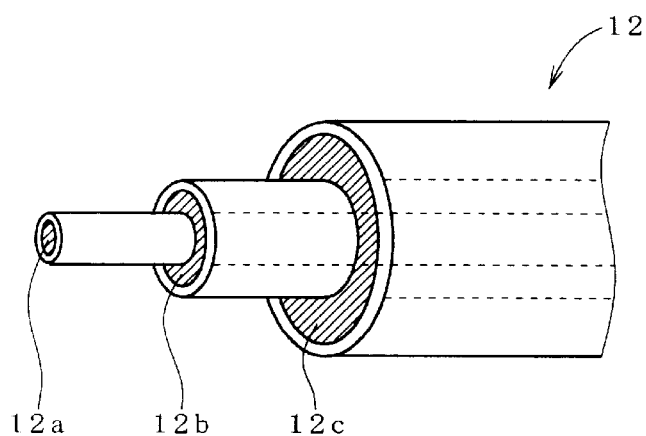
FIG. 9 is a perspective view showing the structure of a triaxial cable.

FIG. 9 is a perspective view showing the structure of the triaxial cable 12. The triaxial cable 12 consists of coaxial cables, namely, a first wire 12a, a second wire 12b, and a third wire 12c each covered with an insulator. The power supply 11 supplies a potential individually to each wire.

Figure 10:
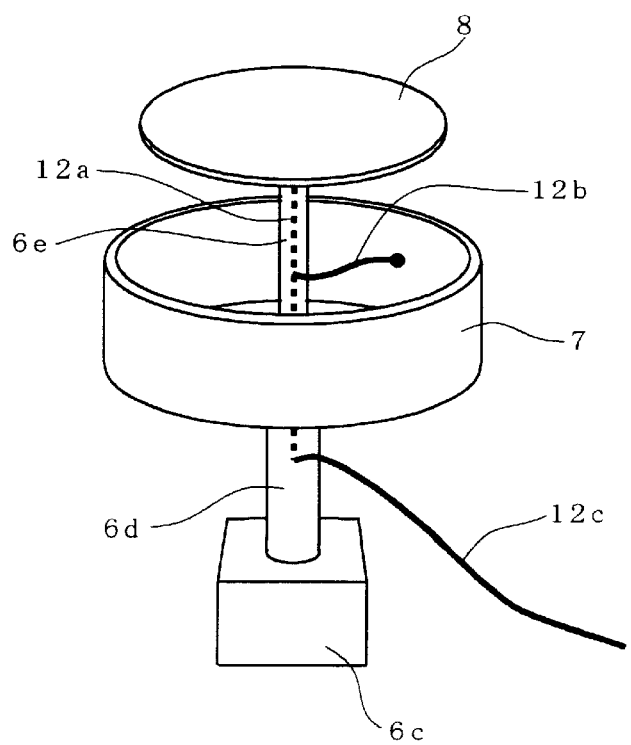
FIG. 10 is a perspective view showing connection conditions of the triaxial cable.

FIG. 10 is a perspective view showing connection conditions of the triaxial cable 12. The first wire 12a and the second wire 12b are connected to the electrode 8a of the chuck 8 and the electromagnetic shielding box 7, respectively, through the inside of the Z loader portion 6e. The third wire 12c is connected to the entire prober, e.g., the Z loader portions 6d and 6e. Then, the power supply 11 supplies the same potential (e.g., 5V) to the first and second wires 12a and 12b, and a ground potential (0V) to the third wire 12c. This establishes a ground for the entire prober excepting the electrode 8a and the electromagnetic shielding box 7 and sets the electrode 8a and the electromagnetic shielding box 7 at the same potential.

According to the prober of the second preferred embodiment, the electrode 8a of the chuck 8 and the electromagnetic shielding box 7 are set at the same potential. This avoids the influence of an electric noise due to a potential difference between the electrode 8a and the electromagnetic shielding box 7, thereby further improving accuracy in the electric evaluation of semiconductor devices in the microcurrent region.

Figure 11:
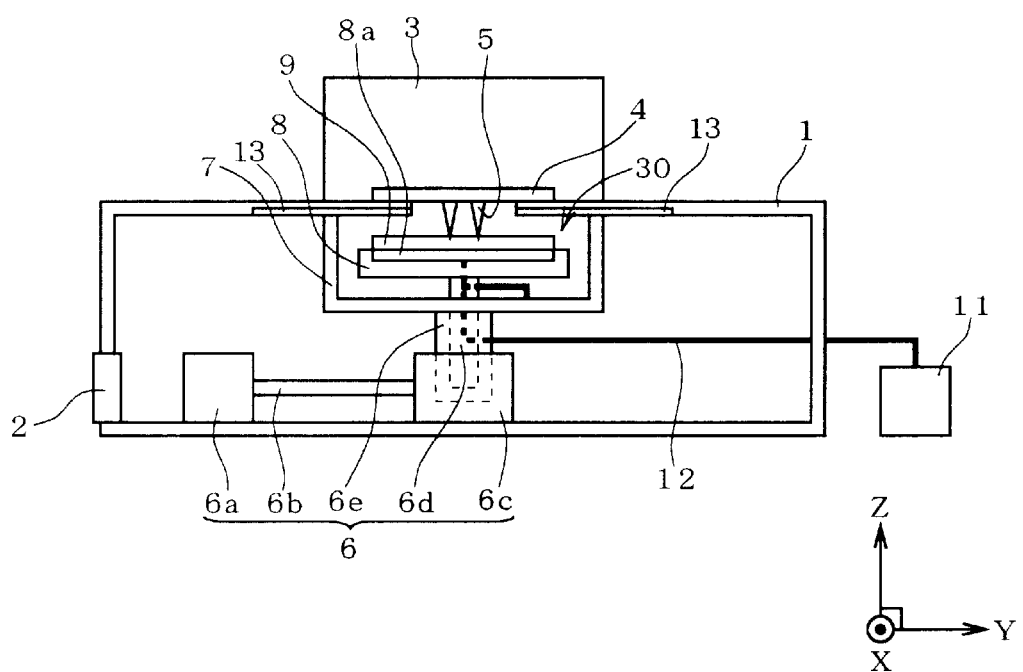
FIG. 11 is a side view schematically showing another structure of the prober according to the second preferred embodiment.

FIG. 11 is a side view schematically showing another structure of the prober according to the second preferred embodiment of the present invention. This is based on the prober in FIG. 8, with metal plates 13 arranged in the upper surface of the casing 1. The metal plate 13 extends from a portion of the upper surface of the casing 1 in contact with the side surfaces of the electromagnetic shielding box 7 in a direction of the closed space 30. This structure allows the power supply 11 to supply the same potential as that of the electrode 8a of the chuck 8 to the metal plates 13 via the second wire 12b and the electromagnetic shielding box 7. Accordingly, functioning as an electromagnetic shielding body, the metal plates 13 can shield electromagnetic waves emitted from the upper surface side of the wafer 9. This further improves the electromagnetic shielding capability of the prober.

3. Third Preferred Embodiment

Figure 12:
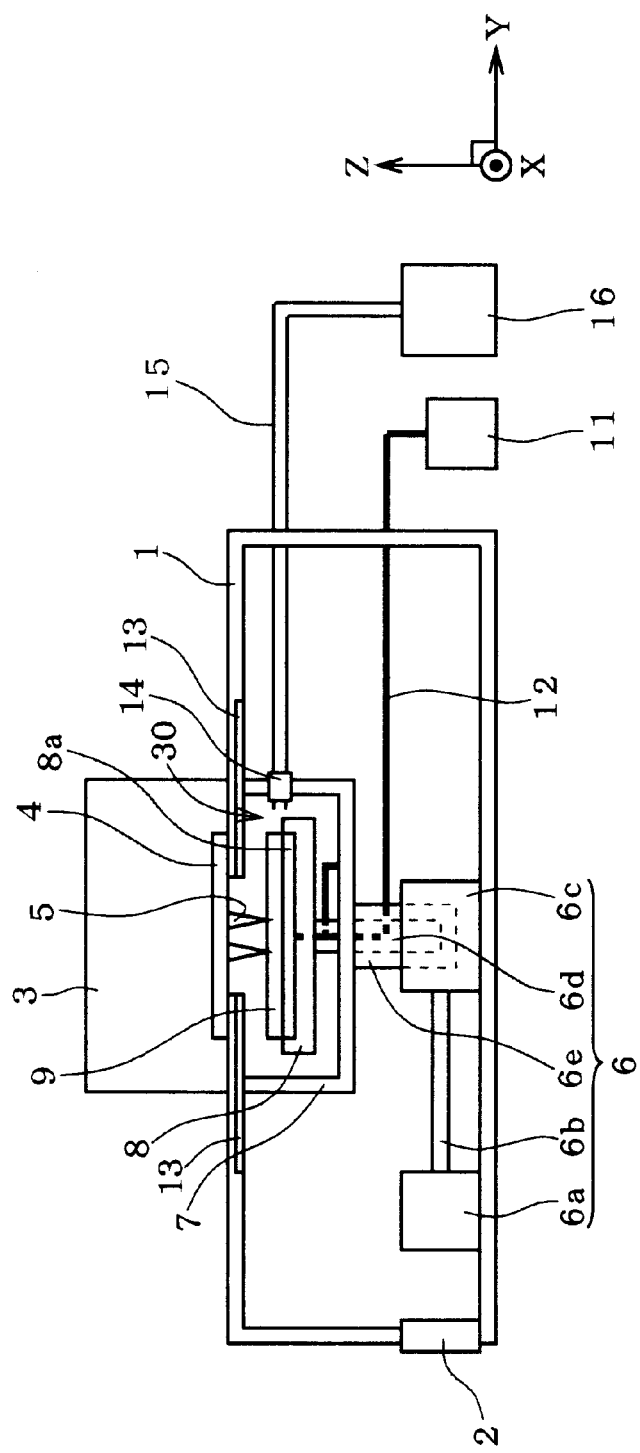
FIG. 12 is a side view schematically showing the structure of a prober according to a third preferred embodiment of the present invention.

FIG. 12 is a side view schematically showing the structure of a prober according to a third preferred embodiment of the present invention. This is based on the prober in FIG. 11, with an inert gas inlet 14 arranged in the side portion of the electromagnetic shielding box 7. The inert gas inlet 14 is connected to piping 15 which is connected to an inert gas supply device 16 outside the casing 1. The other part of the prober according to the third preferred embodiment is similar to that in FIG. 11, but may also be produced based on the prober in FIG. 1 or the prober in FIG. 8.

After forming the closed space 30 by contacting the top ends of the side surfaces of the electromagnetic shielding box 7 with the upper surface of the casing 1 in the fourth step of the first preferred embodiment, inert gas such as nitrogen is introduced into the closed space 30 from the inert gas supply device 16 via the piping 15 and the inert gas inlet 14. Accordingly, the closed space 30 is filled with the inert gas. Then, the tester head 3 applies an electric signal and the power supply 11 supplies a given potential to the semiconductor device to make an electric evaluation of the device.

According to the prober of the third preferred embodiment, the inert gas inlet 14 is arranged in the electromagnetic shielding box 7 and the electric evaluation of semiconductor devices is performed after the closed space 30 is filled with inert gas. This suppresses deterioration with time, such as oxidation of the semiconductor devices and the input and output terminals, during the electric evaluation.

4. Fourth Preferred Embodiment

Figure 13:
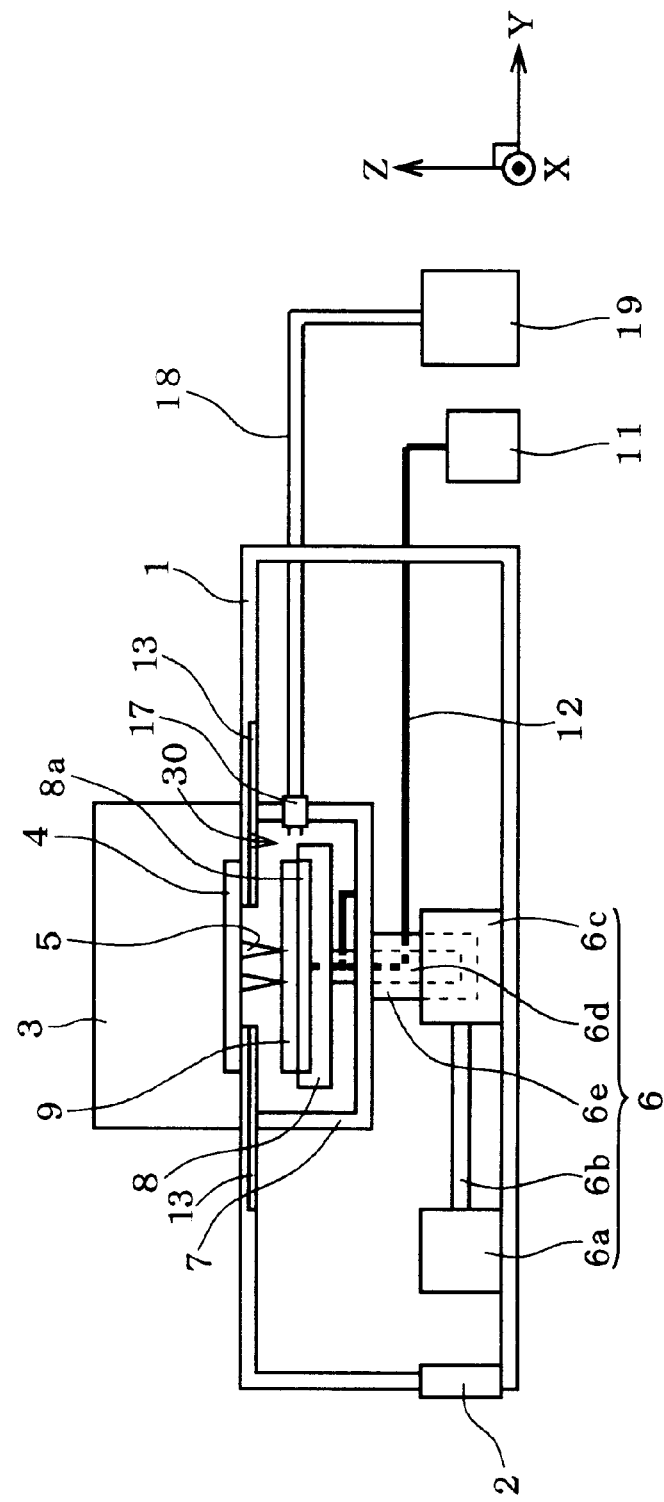
FIG. 13 is a side view schematically showing the structure of a prober according to a fourth preferred embodiment of the present invention.

FIG. 13 is a side view schematically showing the structure of a prober according to a fourth preferred embodiment of the present invention. This is based on the prober in FIG. 11, with an air outlet 17 arranged in the side portion of the electromagnetic shielding box 7. The air outlet 17 is connected to piping 18 which is connected to a rotary pump 19 disposed in the casing 1. The other part of the prober according to the fourth preferred embodiment is similar to that shown in FIG. 11, but may also be produced based on the prober in FIG. 1 or the prober in FIG. 8.

After forming the closed space 30 by contacting the top ends of the side surfaces of the electromagnetic shielding box 7 with the upper surface of the casing 1 in the fourth step of the first preferred embodiment, the rotary pump 19 is driven to exhaust the air from the closed space 30 via the air outlet 17 and the piping 18. This evacuates the closed space 30. Then, the tester head 3 applies an electric signal and the power supply supplies a given potential to a semiconductor device, for the electric evaluation of the device.

According to the prober of the fourth preferred embodiment, the air outlet 17 is arranged in the electromagnetic shielding box 7 and an electric evaluation of semiconductor devices is performed after the closed space 30 is evacuated. This suppresses deterioration with time, such as oxidation of semiconductor devices and the input and output terminals, during the electric evaluation.

5. Fifth Preferred Embodiment

Figure 14:
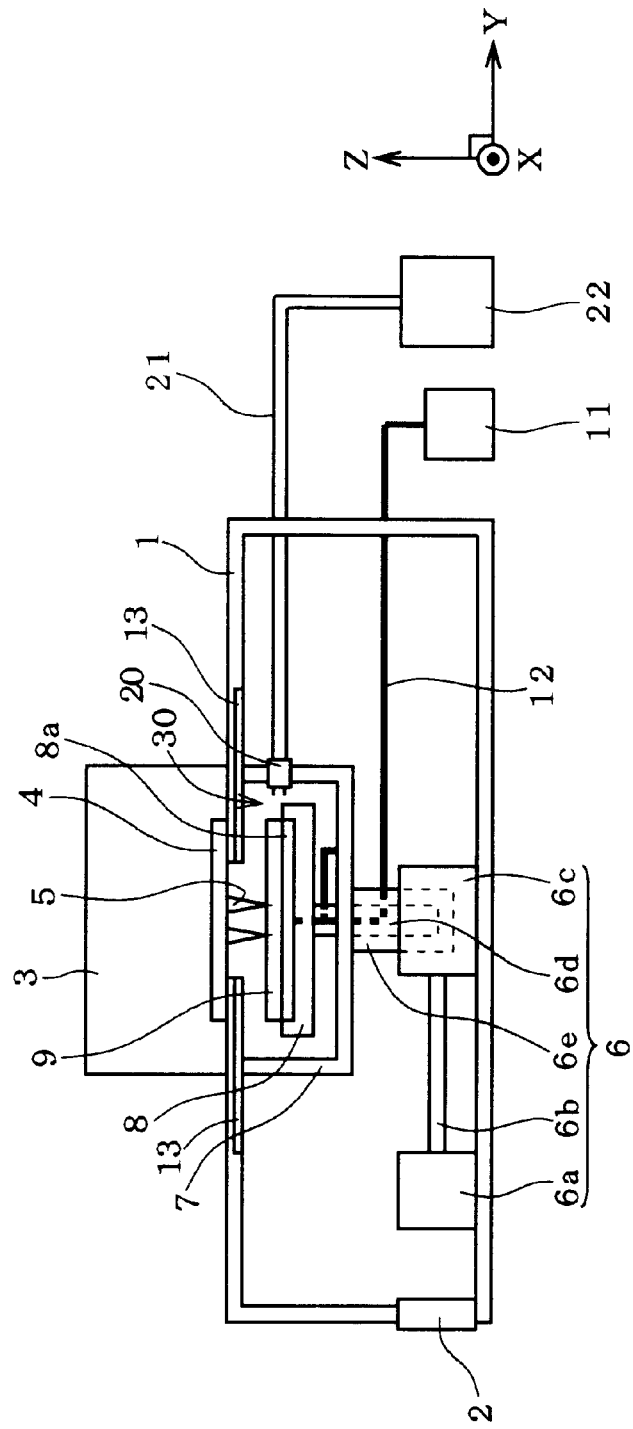
FIG. 14 is a side view schematically showing the structure of a prober according to a fifth preferred embodiment of the present invention.

FIG. 14 is a side view schematically showing the structure of a prober according to a fifth preferred embodiment of the present invention. This is based on the prober in FIG. 11, with a heating/cooling gas inlet 20 arranged in the side portion of the electromagnetic shielding box 7. The heating/cooling gas inlet 20 is connected to piping 21 which is connected to a heating/cooling gas supply device 22 outside the casing 1. The other part of the prober according to the fifth preferred embodiment is similar to that shown in FIG. 11, but may also be produced based on the prober in FIG. 1 or the prober in FIG. 8.

After forming the closed space 30 by contacting the top ends of the side surfaces of the electromagnetic shielding box 7 with the upper surface of the casing 1 in the fourth step of the first preferred embodiment, heating/cooling gas is introduced into the closed space 30 from the heating/cooling gas supply device 22 via the piping 21 and the heating/cooling gas inlet 20. The temperature of the heating/cooling gas can be arbitrarily adjusted by the heating/cooling gas supply device 22. Then, the tester head 3 applies an electric signal and the power supply 11 supplies a given potential to a semiconductor device, for the electric evaluation of the semiconductor device.

According to the prober of the fifth preferred embodiment, the heating/cooling gas inlet 20 is arranged in the electromagnetic shielding box 7 and an electric evaluation of semiconductor devices is performed after heading/cooling gas is introduced into the closed space 30. This makes it possible to arbitrarily adjust the temperature in the closed space 30, in turn, the temperature of the wafer 9, by the temperature of the heating/cooling gas.

Figure 15:
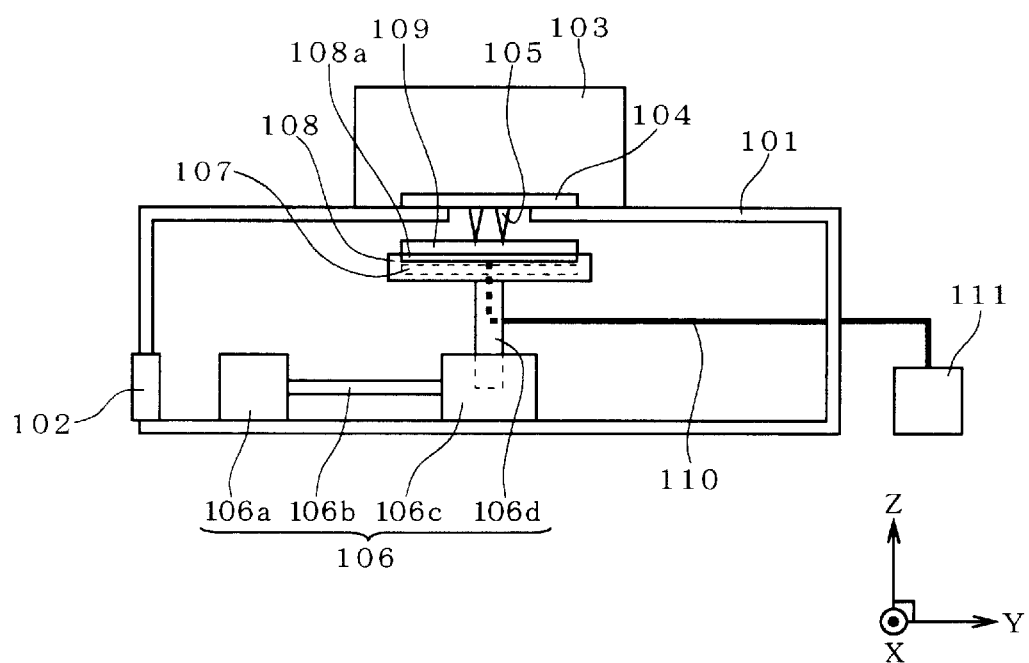
FIG. 15 is a side view schematically showing the structure of a conventional prober.

Now, when the electric heater 107 is provided in the chuck 108 as in the conventional prober shown in FIG. 15, electromagnetic waves produced by the electric heater 107 causes an electric noise during the evaluation. In the prober of the fifth preferred embodiment, on the other hand, the heating/cooling gas supply device 22 is arranged outside the casing 1. Thus, the electromagnetic shielding box 7 (or both the casing 1 and the electromagnetic shielding box 7 when the casing 1 is constituted of an electromagnetic shielding body) can appropriately shield electromagnetic waves produced by the heating/cooling gas supply device 22. This reduces an electric noise due to the electromagnetic waves to several fA levels.

The Japanese Patent Laid-Open No. 62-63439A discloses a prober in which a closed space is formed on a chuck and temperature-controlled air is introduced into the closed space to control the temperature of a wafer. In that prober, however, the closed space is formed with a hood of Teflon (trademark) and a reinforced glass plate, so it is not for the purpose of shielding electromagnetic waves from the outside. On the other hand, the prober according to the fifth preferred embodiment forms the closed space 30 with the electromagnetic shielding box 7, i.e., electromagnetic shielding body. Thus, it can control the temperature of the wafer 9 while shielding electromagnetic waves from the outside. In this respect, the prober of the fifth preferred embodiment is superior to that in the reference.

While the invention has been described in detail, the foregoing description is in all aspects illustrative and not restrictive. It is understood that numerous other modifications and variations can be devised without departing from the scope of the invention.

We claim:

1. A prober comprising:
   a casing having a surface with a signal supply portion configured to supply an electric signal for evaluation to a semiconductor device to be evaluated, said semiconductor device being formed on a wafer;
   a table having a front surface facing said surface of said casing and supporting said wafer; and
   an electromagnetic shielding body having side surfaces which face a side rim of said table and which are in contact with said surface of said casing during the evaluation of said semiconductor device, and a bottom surface facing a back surface of said table, said electromagnetic shielding body forming a space surrounding said table with said surface of said casing, said side surfaces in contact with said surface of said casing, and said bottom surface, wherein
   both said table and said electromagnetic shielding body are disposed within said casing.

2. The prober according to claim 1, wherein
said space surrounding said table is a closed space; and
said electromagnetic shielding body has a gas inlet for introducing inert gas into said closed space.

3. The prober according to claim 1, wherein
said space surrounding said table is a closed space; and
said electromagnetic shielding body has an air outlet configured to evacuate said closed space by exhausting air from said closed space.

4. The prober according to claim 1, wherein
said space surrounding said table is a closed space; and
said electromagnetic shielding body has a gas inlet configured to introduce heating/cooling gas into said closed space to control the temperature in said close space.

5. The prober according to claim 1, wherein
said table has an electrode to establish electric contact with said semiconductor device from a back surface of said wafer; and
said prober further comprising,
   a wire connected to a potential source and configured to maintain said electromagnetic shielding body and said electrode at a same potential.

6. The prober according to claim 5, wherein
said space surrounding said table is a closed space; and
said electromagnetic shielding body has a gas inlet configured to introduce inert gas into said closed space.

7. The prober according to claim 5, wherein
said space surrounding said table is a closed space; and
said electromagnetic shielding body has an air outlet configured to introduce said closed space by exhausting air from said closed space.

8. The prober according to claim 5, wherein
said space surrounding said table is a closed space; and
the electromagnetic shielding body has a gas inlet configured to introduce heating/cooling gas into said closed space to control the temperature in said closed space.

9. The prober according to claim 5 further comprising:
a conductive plate extending from a portion of said surface of said casing in contact with said side surfaces of said electromagnetic shielding body in a direction of said space.

10. The prober according to claim 9, wherein
said space surrounding said table is a closed space; and
said electromagnetic shielding body has a gas inlet for introducing inert gas into said closed space.

11. The prober according to claim 9, wherein
said space surrounding said table is a closed space; and
said electromagnetic shielding body has an air outlet configured to evacuate said closed space by exhausting air from said closed space.

12. The prober according to claim 9, wherein
said space surrounding said table is a closed space; and
said electromagnetic shielding body has a gas inlet configured to introduce heating/cooling gas into said closed space to control the temperature in said closed space.

13. An electric evaluation method for evaluating semiconductor devices using a prober, said prober comprising:
a casing having a surface with a signal supply portion having an electrode supplying an electric signal for evaluation to a semiconductor device to be evaluated;
a table having a front surface facing said surface of said casing and supporting said semiconductor device;
a first driving portion within said casing and configured to drive said table in a normal direction relative to said surface of said casing;
an electromagnetic shielding body having side surfaces facing a side rim of said table and a bottom surface facing a back surface of said table, said electromagnetic shielding body forming a space surrounding said table with said surface of said casing, said side surfaces, and said bottom surface when said side surfaces are in contact with said surface of said casing; and
a second drive portion within said casing and configured to drive said electromagnetic shielding body in said normal direction,
said table, said electromagnetic shielding body, and said first and second driving portions all being disposed within said casing,
said electric evaluation method comprising the steps of:
(a) contacting said semiconductor device with said electrode by driving said table by said first driving portion;
(b) contacting said side surfaces of said electromagnetic shielding body with said surface of said casing by driving said electromagnetic shielding body by said second driving portion; and
(c) after said steps (a) and (b), supplying said electric signal to said semiconductor device from said signal supply portion via said electrode.

14. The electric evaluation method according to claim 13, wherein
said space surrounding said table is a closed space; and
said electromagnetic shielding body has a gas inlet configured to introduce inert gas into said closed space,
said electric evaluation method further comprising the step of:
(d) before said step (c), introducing said inert gas into said closed space from said gas inlet.

15. The electric evaluation method according to claim 13, wherein
said space surrounding said table is a closed stage; and
said electromagnetic shielding body has an air outlet configured to exhaust air from said closed space,
said electric evaluation method further comprising the step of:
(d) before said step (c), evacuating said closed space by exhausting said air from said closed space through said air outlet.

16. The electric evaluation method according to claim 13, wherein
said space surrounding said table is a closed space; and
said electromagnetic shielding body has a gas inlet configured to introduce heating/cooling gas into said closed space,
said electric evaluation method further comprising the step of:
(d) before said step (c), controlling the temperature in said closed space by introducing said heating/cooling gas into said closed space from said gas inlet.

* * * * *